(12) United States Patent
Kondo

(10) Patent No.: US 6,242,080 B1
(45) Date of Patent: Jun. 5, 2001

(54) ZINC OXIDE THIN FILM AND PROCESS FOR PRODUCING THE FILM

(75) Inventor: Takaharu Kondo, Kyotanabe (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 09/110,142

(22) Filed: Jul. 6, 1998

(30) Foreign Application Priority Data

Jul. 9, 1997 (JP) .................................................. 9-199427

(51) Int. Cl.⁷ ...................................................... B32B 33/00
(52) U.S. Cl. ........................ 428/210; 428/469; 428/472; 428/698; 428/700; 428/701; 428/702
(58) Field of Search ..................... 428/469, 472, 428/698, 700, 701, 702

(56) References Cited

U.S. PATENT DOCUMENTS

| 4,638,111 | * | 1/1987 | Gay . |
| 4,717,458 | | 1/1988 | Martin et al. . |
| 5,514,466 | * | 5/1996 | Yamada et al. . |
| 5,569,548 | * | 10/1996 | Koike et al. . |

FOREIGN PATENT DOCUMENTS

| 0794270A1 | 9/1997 | (EP) . |
| 8-217443 | 8/1996 | (JP) . |
| 09299791A | * 11/1997 | (JP) . |
| 11052597A | * 2/1999 | (JP) . |

OTHER PUBLICATIONS

I., Ĉevneň, et al., "Texture of obliquely sputtered ZnO thin films", Journal of Crystal Growth, 1993, vol. 131, pp. 546–550.
Izaki, Masanobu, et al., "Electrolyte Optimization for Cathodic Growth of Zinc Oxide Films," J. Electrochem. Soc., 1996, vol. 143, pp. L53–55.
Sannomiya, H., "a–SiC/a–Si/a–SiGe Multi–Bandgap Stacked Solar Cells with Bandgap Profiling," Technical Digest of the International PVSEC–5, 1990, pp. 387–390.
29p–MF–2, "Optical Confinement Effect in a–SiGe Solar Cells on Stainless Steel Substrate," Extended Abstracts (The 51st Autumn Meeting, 1990).

* cited by examiner

Primary Examiner—Deborah Jones
Assistant Examiner—Jennifer McNeil
(74) Attorney, Agent, or Firm—Fitzpatrick, Cella, Harper & Scinto

(57) ABSTRACT

Provided are a zinc oxide thin film having an X-ray diffraction peak of the (103) plane of zinc oxide crystal, a photoelectric conversion element having the zinc oxide thin film, and production processes thereof. By these, the texture level of the zinc oxide thin film is increased and the photoelectric conversion element is provided with excellent short circuit current density (Jsc).

7 Claims, 3 Drawing Sheets

(002) PLANE  (103) PLANE  (101) PLANE

ZINC OXIDE THIN FILM AND PROCESS FOR PRODUCING THE FILM

BACKGROUND OF THE INVENTION

1. Field of the Invention

The present invention relates to a zinc oxide thin film, a process for producing the zinc oxide thin film, a photoelectric conversion element having the zinc oxide thin film, and a process for producing the photoelectric conversion element. More particularly, the invention relates to a zinc oxide thin film having formed a considerably uneven surface shape with the optical confinement effect so as to be increased in the texture level, a photoelectric conversion element having the zinc oxide thin film, and processes for producing them.

2. Related Background Art

The photoelectric conversion elements having a semiconductor layer comprised of hydrogenated amorphous silicon, hydrogenated amorphous silicon germanium, hydrogenated amorphous silicon carbide, microcrystal silicon, polycrystal silicon, or the like have been utilized heretofore with a reflective layer being provided on a back surface of the semiconductor layer in order to improve the collection efficiency at long wavelengths. Such a reflective layer should desirably demonstrate effective reflection characteristics at wavelengths near the band edge of the semiconductor materials where absorption thereof is small, i.e., at 800 nm to 1200 nm.

Materials adequately satisfying this condition are metals such as gold, silver, copper, and aluminum, and alloys thereof.

Further, another technology is also employed which provides an optically transparent layer with an unevenness in a predetermined wavelength range to attain optical confinement. Generally, an attempt has been made to provide between the aforementioned metal layer and the semiconductor layer, a transparent electroconductive layer having an unevenness to effectively utilize reflected light, thus improving the short circuit current density Jsc.

In addition, the transparent electroconductive layer prevents decreases in performance characteristics due to shunt paths.

Further, in order to effectively utilize incident light to improve the short circuit current density Jsc, there is also another attempt to provide the transparent electroconductive layer having an unevenness on the light incidence side of the semiconductor layer to increase path lengths of the incident light in the semiconductor layer.

Most generally, these layers are formed by methods such as vacuum vapor deposition and sputtering and shows an improvement of 1 mA/cm$^2$ or more in terms of the short circuit current density Jsc.

Examples thereof are Prior art 1: "29p-MF-22: Optical confinement effect in a-SiGe solar cells on stainless steel substrate," Extended Abstracts (The 51th Autumn Meeting, 1990); The Japan Society of Applied Physics, p. 747, Prior art 2: "P-IA-15 a-SiC/a-Si/a-SiGe Multi-Bandgap Stacked Solar Cells With Bandgap Profiling," Sannomiya et al., Technical Digest of the International PVSEC-5, Kyoto, Japan, p. 381, 1990, and so on, which describe the reflectivity and texture structure of a reflective layer comprised of silver atoms.

These examples describe that forming the reflective layer by deposition of two silver layers at different substrate temperatures to form an effective unevenness, accomplished an increase in the short circuit current by the optical confinement effect by a combination thereof with a zinc oxide layer.

On the other hand, "Electrolyte Optimization for Cathodic Growth of Zinc Oxide Films" M. IZAKI and T. Omi, J. Electrochem. Soc., Vol. 143, March 1996, L53 and Japanese Patent Application Laid-Open No. 8-217443 describe a method for uniformly making a zinc oxide film with excellent transmittance as the aforementioned transparent electroconductive layer by electrolysis of an aqueous solution containing zinc ions and nitric ions.

The transparent electroconductive layers produced by vacuum vapor deposition or sputtering, disclosed heretofore as described above, had excellent photoelectric conversion characteristics, but, because they were the zinc oxide thin films having the crystal structure of the c axis orientation according to the law of Bravais, forming the transparent electroconductive layer having the unevenness structure necessitated preparation at a high temperature or increase in thickness.

No attempt has been made heretofore yet to deposit by electrolysis the zinc oxide thin film provided with the uneven shape exhibiting good optical confinement effect.

Thus, the present invention has been accomplished to solve the above issue and an object of the present invention is to provide a zinc oxide thin film with an increased texture level and improved short circuit current density (Jsc) but without the need for the preparation under high-temperature conditions nor for an increase in thickness, and to provide a photoelectric conversion element comprised of the zinc oxide thin film.

SUMMARY OF THE INVENTION

The present invention thus provides a zinc oxide thin film having an X-ray diffraction peak of the (103) plane of zinc oxide crystal. The present invention also provides a zinc oxide thin film having an X-ray diffraction pattern such that an X-ray diffraction intensity of the (103) plane of zinc oxide crystal is ⅓ or more of an X-ray diffraction intensity of the (002) plane of zinc oxide crystal.

Further, the present invention provides a zinc oxide thin film having an X-ray diffraction pattern such that an X-ray diffraction intensity of the (103) plane of zinc oxide crystal is not less than an X-ray diffraction intensity of the (101) plane of zinc oxide crystal.

The present invention also provides a zinc oxide thin film having an X-ray diffraction pattern such that an X-ray diffraction intensity of the (103) plane of zinc oxide crystal is ⅓ or more of an X-ray diffraction intensity of the (002) plane of zinc oxide crystal and is not less than an X-ray diffraction intensity of the (101) plane of zinc oxide crystal.

Further, the present invention provides a process for producing a zinc oxide thin film using electrocrystallization, which comprises controlling the orientation of zinc oxide crystal as described above.

In addition, the present invention provides a photoelectric conversion element comprising a substrate, a first transparent electroconductive layer, a semiconductor layer, and a second transparent electroconductive layer, wherein at least one of the transparent electroconductive layers is the aforementioned zinc oxide thin film, and a production process thereof.

DESCRIPTION OF THE PREFERRED EMBODIMENTS

The above constitution of the present invention that the texture level is increased by the feature wherein the X-ray diffraction intensity of the (103) plane is a predetermined ratio or more of the X-ray diffraction intensity of the (002) plane in the zinc oxide crystal, is based on the knowledge that if in the plane-orientation relation of zinc oxide crystal, such a tendency becomes stronger that a face parallel to the (103) plane grows so as to be parallel to the substrate than the tendency that a face parallel to the (002) plane do so, the surface configuration with sufficient unevenness can be readily achieved without high-temperature preparation or the increase in the film thickness. This knowledge was obtained as a result of extensive and intensive research by the inventor in order to solve the aforementioned issue.

Figure 1:
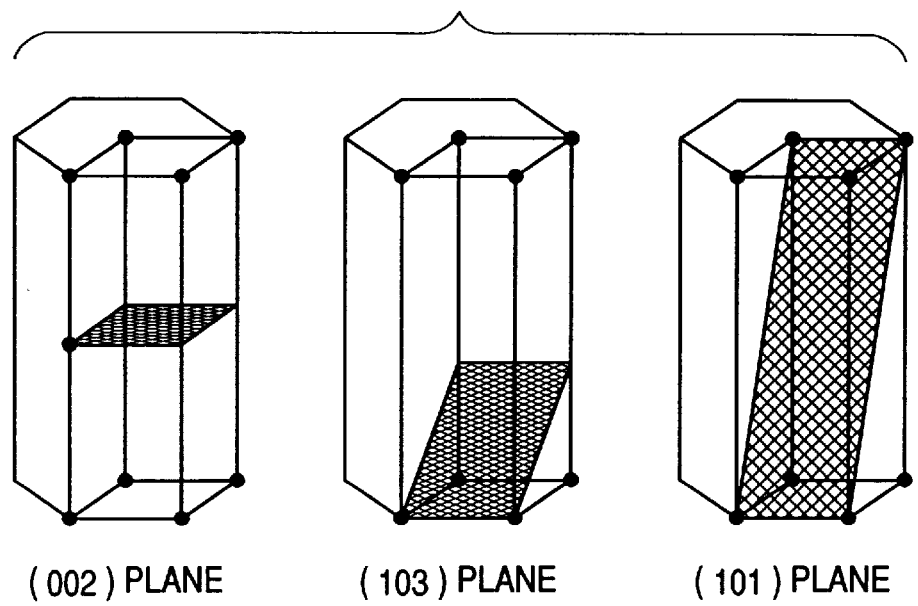
FIG. 1 is a schematic illustration for explaining the plane-orientation of zinc oxide crystal.

This will be described in further detail. FIG. 1 is a drawing to show the plane-orientation relation of a zinc oxide crystal of the hexagonal system.

When a crystal grows in such a direction that the c-axis becomes perpendicular to the substrate, a face parallel to the (002) plane develops in the top surface. The (002) plane is the closest packed plane of the zinc oxide crystal. When a face parallel to this plane develops in the top surface, the crystal becomes more likely to have the surface configuration with less unevenness.

On the other hand, the (103) plane has an inclination relative to the closest packed plane of the zinc oxide crystal as shown in FIG. 1. When the tendency that a face parallel to this plane grow so as to be parallel to the substrate is strong, the crystal becomes more likely to have the surface configuration with sufficient unevenness. The specific reason thereof is not clear yet, but it is conceivable that deviation from the law of Bravais increases position dependence of deposition rate.

The zinc oxide thin films can be provided with various orientations, depending upon their production methods and production conditions. When the dominant orientation is the one where a face parallel to the (002) plane appears in the top surface as described above, the crystal comes to have the surface configuration with less unevenness. It was, therefore, necessary to form the zinc oxide thin film at a high temperature or to increase the thickness of the zinc oxide thin film in order to obtain the texture structure.

In this case, there are problems that the production at high temperatures is disadvantageous in respect of cost and that the increase in the film thickness increases the loss of light due to absorption by the film.

On the other hand, with increasing tendency that a face parallel to the (103) plane grows so as to be parallel to the substrate, it becomes possible to readily obtain the surface configuration with sufficient unevenness but without the need for such means as the production at high temperatures or the increase in the thickness, which is more advantageous for texturing.

It is preferred for the zinc oxide thin film of the present invention that the X-ray diffraction intensity of the (103) plane be not less than the X-ray diffraction intensity of the (101) plane. The reason is as follows.

Specifically, the inclination of the (101) plane to the (002) plane is further greater than that of the (103) plane to the (002) plane. If the tendency that a face parallel to such a plane with a larger inclination to the (002) plane grows so as to be parallel to the substrate, the surface will become likely to have irregular cracks and abnormal projections. The specific reason thereof is not clear, but it is conceivable that when a face with greater deviation from the law of Bravais becomes dominant, a balance of tension between crystal grains is not achieved.

On the other hand, when the X-ray diffraction intensity of the (103) plane is larger than that of the (101) plane, the surface configuration with sufficient unevenness can be obtained without such irregular cracks nor abnormal projections.

Further, the zinc oxide thin film of the present invention is preferably produced by electrocrystallization.

There are various methods known for forming the zinc oxide thin film, among which the vacuum vapor deposition by resistance heating or electron beam sputtering, ion plating, and CVD involve factors to increase the cost, including the high cost for preparing target materials, a large depreciation expense for vacuum system, and not so high utilization efficiency of materials; whereas, when the zinc oxide thin film is formed on the electroconductive substrate by electrocrystallization, the zinc oxide thin film with high quality can be produced at more advantageous material cost and running cost and in the simple structure of a production apparatus.

When the zinc oxide thin film described above is used for the transparent electroconductive layer in the photoelectric conversion element having the transparent conductive layer, the photoelectric conversion element can be produced in good yield and with good uniformity, because the zinc oxide thin film can be obtained at low cost, with high photoelectric conversion efficiency, and with less irregular cracks.

Next described is an example in which a solar cell is formed as a photoelectric conversion element, using the zinc oxide thin film of the present invention.

Figure 2:
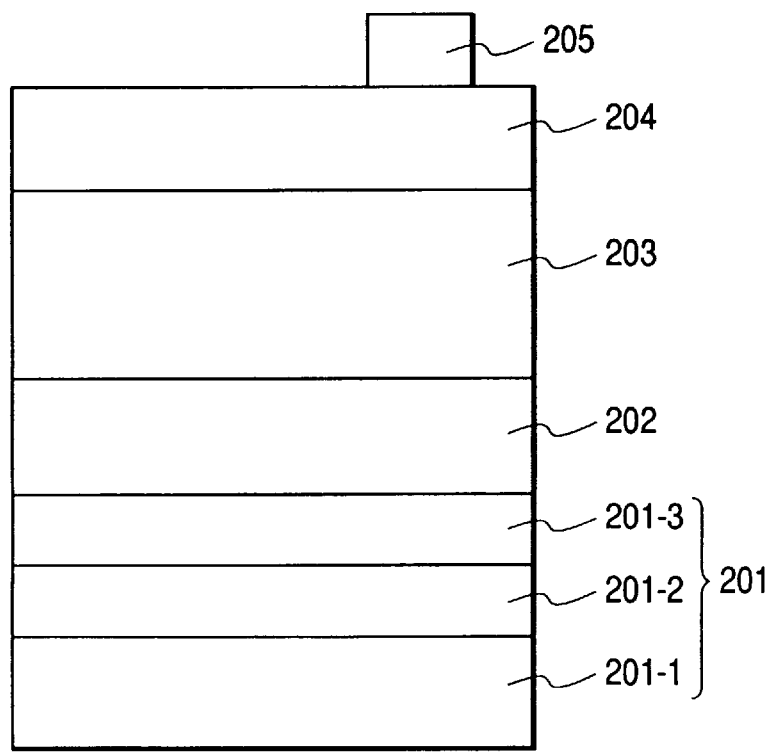
FIG. 2 is a schematic sectional view showing the layer structure of an example of a photovoltaic element as an embodiment of the photoelectric conversion element of the present invention.

FIG. 2 is a schematic sectional view of an example of a photovoltaic element according to the present invention.

An electroconductive substrate 201 is comprised of a support of 201-1 in the drawing, and has a metal layer of 201-2 and/or a transparent electroconductive layer of 201-3 as occasion may demand.

Further, numeral 202 designates a transparent electroconductive layer, 203 a semiconductor layer, 204 a transparent electroconductive layer, and 205 a collector electrode.

In the present invention, by forming the transparent conductive layer 202 and/or the transparent conductive layer 204 in the photovoltaic element described above by use of the zinc oxide thin film of the present invention, it becomes possible to realize the photovoltaic element of high yield and improved uniformity.

The sunlight is incident on the 204 side of the photovoltaic element. Most of the light at shorter wavelengths than 500 nm is absorbed by the next semiconductor layer 203.

On the other hand, the light of longer wavelengths than about 700 nm, which is the wavelength longer than the band absorption edge of the semiconductors, is transmitted in part by the semiconductor layer 203 to travel through the transparent conductive layer 202, which is a transmissive layer. Then the light is reflected by the metal layer 201-2 or the support 201-1 and again passes through the transparent conductive layer 202. Part or most of the light is then absorbed by the semiconductor layer 203.

If there is unevenness formed in the support 201-1 and/or the metal layer 201-2 and/or the transparent conductive layers 201-3, 202 being the transparent layers and/or the semiconductor layer 203 and/or the transparent conductive layer 204 and if the unevenness is sufficient to bend paths of light, optical path lengths of the light passing through the semiconductor layer 203 become longer by an inclination of the optical paths, and increase can be expected in absorption.

This increase of absorption due to the extension of optical path lengths is so little in the layer transparent to the light, but the absorption increases exponentially in the region where some absorption occurs, i.e., where the wavelengths of the light are those near the absorption edge of substance.

Since the transparent conductive layer 202 and/or the transparent conductive layer 204 is transparent to the light in the region from the visible light to the near infrared light, the absorption there is insignificant. On the other hand, the increase of optical path lengths results in extremely large absorption of light at 600 nm to 1200 nm in the semiconductor layer 203.

Figure 3:
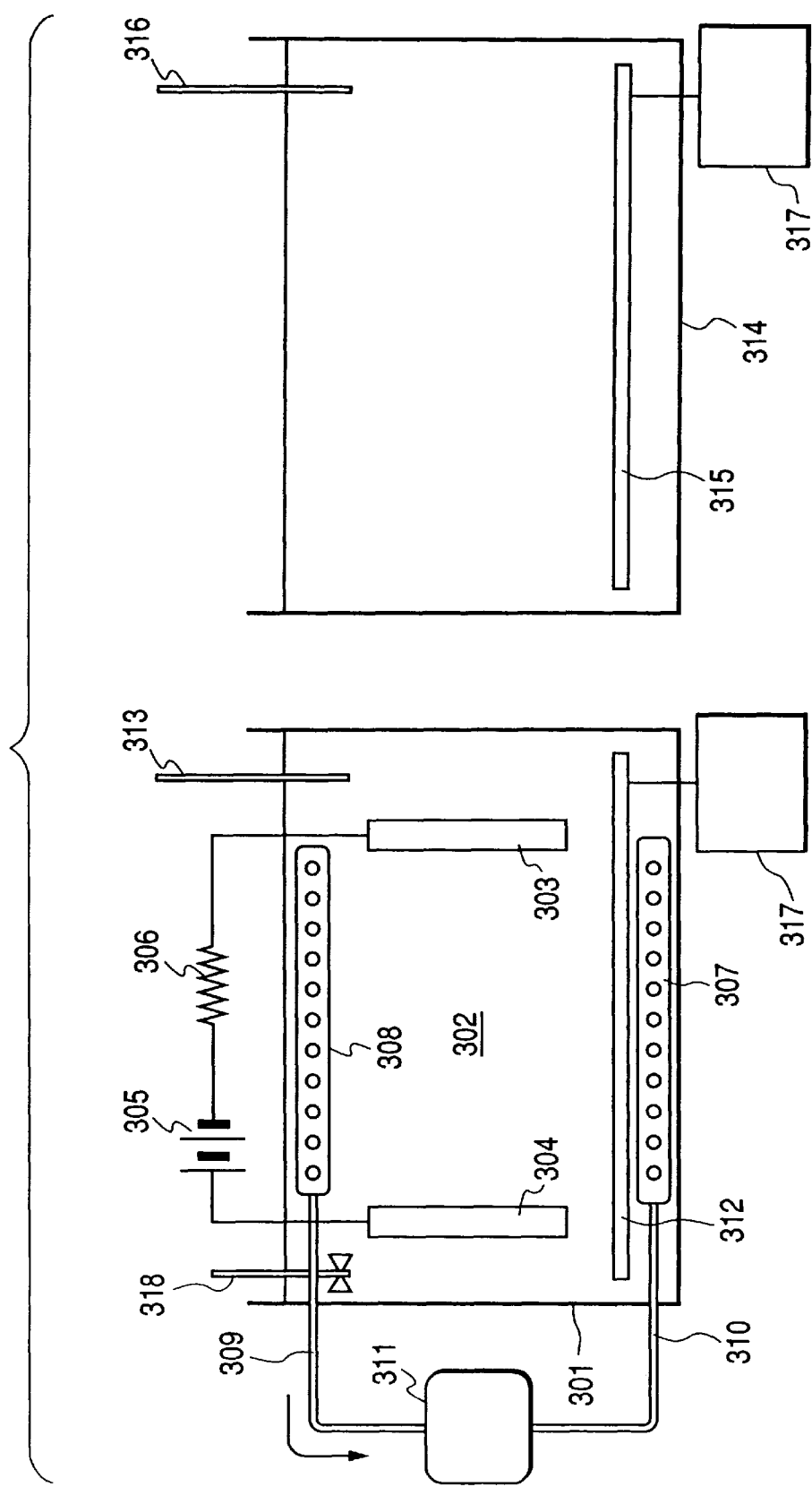
FIG. 3 is a schematic sectional view showing an example of a production apparatus used for producing the zinc oxide thin film of the present invention.

The zinc oxide thin film of the present invention can be formed by electrocrystallization, for example, using the apparatus shown in FIG. 3.

In the drawing reference numeral 301 denotes an anticorrosive vessel which retains an aqueous solution 302 containing nitric ions, zinc ions, and a carbohydrate.

For obtaining the desired transparent conductive film 202 and/or 204, the concentrations of nitric ions and zinc ions are desirably each in the range of 0.001 mol/l to 1.0 mol/l, more desirably in the range of 0.01 mol/l to 0.5 mol/l, and still more desirably in the range of 0.1 mol/l to 0.25 mol/l.

There is no specific limitation on supply sources of the nitric ions and zinc ions, but they may be zinc nitrate, which is a supply source of the both ions, or a mixture of a water-soluble nitrate such as ammonium nitrate, which is a supply source of nitric ions, with a salt of zinc such as zinc sulfate, which is a supply source of zinc ions.

There is no specific limitation on a kind of the carbohydrate, either, but there can be used monosaccharides such as glucose (grape sugar) or fructose (fruit sugar), disaccharides such as maltose (malt sugar) or saccharose (cane sugar), polysaccharides such as dextrin or starch, and mixtures thereof.

For obtaining the zinc oxide thin film with excellent uniformity and adhesion but without abnormal growth, the amount of the carbohydrate in the aqueous solution is desirably in the range of 0.001 g/l to 300 g/l, more desirably in the range of 0.005 g/l to 100 g/l, and still more desirably in the range of 0.01 g/l to 60 g/l.

Numeral 303 designates the electroconductive substrate described above, which is used as a cathode. Numeral 304 denotes a counter electrode, and a material for the counter electrode 304 can be zinc which is the metal deposited by liquid phase deposition, or platinum or carbon, for example. The counter electrode 304 is used as an anode.

The conductive substrate 303 of the cathode and the counter electrode 304 of the anode are connected through a load resistor 306 and a power supply 305 to be set so that an almost constant current flows between the two electrodes. In order to obtain the desired transparent conductive film 202 and/or 204, the current density is desirably not less than 10 mA/dm nor more than 10 A/dm.

In the present embodiment, in order to agitate the solution to reduce nonuniformity in layer formation and to raise the layer-forming rate to increase efficiency, there is employed a solution circulating system consisting of an inflow bar 308 having a plurality of solution inflow ports, an outflow bar 307 similarly having a plurality of solution outflow ports, a solution circulating pump 311, an inflow solution pipe 309 connecting between the solution inflow bar 308 and the solution circulating pump 311, and an outflow solution pipe 310 connecting between the solution outflow bar 307 and the solution circulating pump 311. The solution circulating system circulates the solution in the direction shown by the arrow along the inflow solution pipe 309 in FIG. 3.

If the system is of a small scale, a magnetic stirrer 318 can replace the above solution circulating system.

A temperature control of the aqueous solution is carried out with monitoring the temperature by use of a heater 312 and a thermocouple 313.

For obtaining the desired transparent conductive film 202 and/or 204, the temperature of the aqueous solution is desirably not less than 50° C.

The transparent conductive film 202 and/or 204 each may be a single film or a stack of plural films. A hot water bath 314 is provided for heating the substrate 303 before preparation of the zinc oxide thin film, and retains hot water the temperature of which is adjusted by use of a heater 315 and a thermocouple 316, thereby allowing the substrate 303 to be preliminarily heated. In FIG. 3, numerals 317 each designate a power source for heater.

The electroconductive substrate 201 used in the present invention is one having the base of the support 201-1 of either of various magnetic or nonmagnetic metals.

Preferred materials for the support 201-1 are a stainless steel sheet, a steel sheet, a copper sheet, a brass sheet, an aluminum sheet, and so on, which are relatively inexpensive. These metal sheets may be cut into a certain shape or may be used in a long sheet shape, depending upon the thickness.

In the case of the long sheet shape, because the sheet can be rolled in a coil shape, compatibility is good with continuous production, and storage and transportation is also easier.

Further, a crystal substrate of silicon or a glass or ceramic sheet may be used, depending upon application thereof. The surface of the support may be polished, but it may be used as it is, if finished well, for example, like a stainless steel sheet subjected to bright annealing.

The metal layer 201-2 is not indispensable, but, when using a support which itself has a low reflectivity, such as stainless steel or sheet iron, or a support made of a material which itself has a low electric conductivity, such as glass or ceramics, it is preferable to provide the metal layer 201-2 with a high reflectivity, such as silver, copper, gold, or aluminum, on the support.

When aluminum is used for the metal layer 201-2, it is preferable for preventing the aluminum from being dissolved in the aqueous solution to provide a very thin, transparent, electroconductive layer 201-3 on the metal layer 201-2 by sputtering or the like.

The semiconductor layer 203 used in the present invention is formed of a semiconductor material with a structure for sensing light to generate electromotive force, and examples of the structure are the pn junction, the pin junction, the Schottky junction, the hetero junction, and so on. Examples of the semiconductor material are amorphous semiconductor materials such as a-Si:H (abbreviation of hydrogenated amorphous silicon), a-Si:F, and a-Si:H:F, microcrystalline semiconductor materials such as $\mu$C-Si:H (abbreviation of hydrogenated microcrystal silicon), $\mu$C-Si:F, and $\mu$C-Si:H:F, and so on.

The semiconductor layer may be subjected to valence electron control and bandgap control. Specifically, the control may be carried out by introducing into a deposition space a source compound containing an element as a valence electron controller or as a bandgap controller singly or in combination with a source gas for formation of the deposited film or with a diluent gas during formation of the semiconductor layer.

Further, the semiconductor layer is doped in the p-type and the n-type at least in part by the valence electron control, thus forming at least one pin junction.

The semiconductor layer is formed by a forming method selected from the following methods; various CVD processes such as the microwave plasma CVD process, the RF plasma CVD process, the photo CVD process, the thermal CVD process, and the MOCVD process; various evaporation processes such as EB evaporation, MBE, ion plating, and ion beam process; sputtering, spraying, printing, and so on. Preferred methods industrially employed are the plasma CVD processes comprising decomposition of a source gas by a plasma and deposition on a substrate. As the reaction apparatus, there may be used batch type apparatuses and continuous film formation apparatuses, as desired.

Described below in further detail is the semiconductor layers using silicon-based non-single-crystal semiconductor materials particularly suitable for the photovoltaic element of the present invention.

(1) I-type semiconductor layer (intrinsic semiconductor layer)

In the photovoltaic elements using the silicon-based non-single-crystal semiconductor materials, the i-type layer used for the pin junction is an important layer for generating and transporting carriers with reception of incident light.

As the i-type layer, there can also be used a substantially i-type semiconductor layer of a little p-type or a little n-type. The silicon-based non-single-crystal semiconductor materials contain hydrogen atoms (H, D) or halogen atoms (X) as described above, which have a significant function.

The hydrogen atoms (H, D) or halogen atoms (X) contained in the i-type layer have a function of compensating for unbound bonds (dangling bonds) of the i-type layer, thereby increasing the product of mobility and lifetime of carriers in the i-type layer.

These atoms also have a function of compensating for the interface states at the interfaces between the p-type layer and the i-type layer or between the n-type layer and the i-type layer, thus achieving the effect of increasing the electromotive force, photocurrent, and photoresponsivity of photovoltaic elements. An optimum content of the hydrogen atoms and/or halogen atoms in the i-type layer is 1–40 atomic %. Particularly, a preferred profile is such a distribution that contents of the hydrogen atoms and/or halogen atoms are higher on the interface side between the p-type layer and the i-type layer and between the n-type layer and the i-type layer. The contents of the hydrogen atoms and/or halogen atoms at a portion near the interfaces are preferably in the range of 1.1 to 2 times those in the bulk. Further, it is preferable that the contents of the hydrogen atoms and/or halogen atoms vary corresponding to the contents of silicon atoms.

The amorphous silicon and microcrystal silicon are denoted by a-Si:H, a-Si:F, a-Si:H:F, $\mu$C-Si:H, $\mu$C-Si:F, $\mu$C-Si:H:F, and so on, depending upon the element(s) for compensating for the dangling bonds.

Further, as the i-type semiconductor layers suitably applicable to the photovoltaic elements of the present invention, there can preferably be used those in which the contents of hydrogen atoms ($C_H$) are 1.0–25.0%, the photoconductivity ($\sigma p$) under radiation with a solar simulator of AM 1.5 and 100 mW/cm$^2$ is not less than $1.0 \times 10^{-7}$ S/cm, the dark conductivity ($\sigma d$) is not more than $1.0 \times 10^{-9}$ S/cm, the Urbach energy by the constant photocurrent method (CPM) is not more than 55 meV, and the localized state density is not more than $10^{17}$/cm$^3$.

(2) Doped layers (p-type semiconductor layer or n-type semiconductor layer)

The doped layers (p-type semiconductor layer or n-type semiconductor layer) are also important layers which affect characteristics of the photovoltaic element of the present invention.

Examples of the amorphous materials (abbreviated as a-) or microcrystal materials (abbreviated as $\mu$c-) for the doped layers are the following materials doped with a high concentration of a p-type valence electron controller (Group III elements of the periodic table: B, Al, Ga, In, or Tl) or an n-type valence electron controller (Group V elements of the periodic table: P, As, Sb, or Bi); a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, $\mu$c-Si:H, $\mu$c-Si:HX, $\mu$c-SiC:H, $\mu$c-SiC:HX, $\mu$c-SiO:H, $\mu$c-SiO:HX, $\mu$c-SiN:H, $\mu$c-SiN:HX, $\mu$c-SiGeC:H, $\mu$c-SiGeC:HX, $\mu$c-SiON:H, $\mu$c-SiON:HX, $\mu$c-SiOCN:H, $\mu$c-SiOCN:HX, and so on. Examples of the polycrystal materials (abbreviated as poly-) are the following materials doped with a high concentration of the p-type valence electron controller (Group III elements of the periodic table: B, Al, Ga, In, or Tl) or the n-type valence electron controller (Group V elements of the periodic table: P, As, Sb, or Bi); poly-Si:H, poly-Si:HX, poly-SiC:H, poly-SiC:HX, poly-SiO:H, poly-SiO:HX, poly-SiN:H, poly-SiN:HX, poly-SiGeC:H, poly-SiGeC:HX, poly-SiON:H, poly-SiON:HX, poly-SiOCN:H, poly-SiOCN:HX, poly-Si, poly-SiC, poly-SiO, poly-SiN, and so on.

Particularly, for the p-type layer or the n-type layer on the light incidence side, a crystalline semiconductor layer with little absorption of light or an amorphous semiconductor layer with a wide bandgap is suitable.

The hydrogen atoms (H, D) or halogen atoms contained in the p-type layer or in the n-type layer function to compensate for the dangling bonds of the p-type layer or the n-type layer, so as to increase the doping efficiency of the p-type layer or the n-type layer. A preferred amount of the hydrogen atoms or halogen atoms added in the p-type layer or in the n-type layer is 0.1% to 50%, and, in the case of the p-type layer or the n-type layer being amorphous, the amount of the hydrogen atoms or halogen atoms is more preferably 1% to 40%. When the p-type layer or the n-type layer is crystalline, an optimum amount of the hydrogen atoms or the halogen atoms is 0.1% to 10%.

For the electric characteristics of the p-type layer and the n-type layer of photovoltaic element, the activation energy is preferably not more than 0.2 eV and most preferably not more than 0.1 eV.

The resistivity is preferably not more than 100 $\Omega$cm and most preferably not more than 1 $\Omega$cm. Further, the thickness of the p-type layer and the n-type layer is preferably 1–50 nm and most preferably 3–10 nm.

(3) Method for forming the semiconductor layer

A production process suitable for forming the silicon-based non-single-crystal semiconductor materials suitable for the semiconductor layer of the photovoltaic element of the present invention is the plasma CVD process using a high-frequency wave. The frequency of the high-frequency wave is preferably in the range of 10 MHz to 3 GHz. Specifically, the high-frequency wave is, for example, an RF wave of 13.56 MHz or the like, a VHF wave of 100 MHz or the like, or a microwave of 2.45 GHz or the like.

A source gas suitable for deposition of the silicon-based non-single-crystal semiconductor layers suitable for the photovoltaic element of the present invention is a gasifiable compound containing silicon atoms.

Specifically, as the gasifiable compound containing silicon atoms, there is used a chain or cyclic silane compound, and specific examples thereof are such gas-state or readily gasifiable compounds as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F_3$, and so on.

The substance introduced for valence electron control into the p-type layer or into the n-type layer includes the Group III elements and the Group V elements of the periodic table.

As a starting substance effectively used for introduction of the Group III elements, there may be included, specifically for introduction of boron atoms, boron hydrides such as $B_2H_6$, $B_4H_{10}$, $B_5H_9$, $B_5H_{11}$, $B_6H_{10}$, $B_6H_{12}$, and $B_6H_{14}$, boron halides such as $BF_3$ and $BCl_3$, and so on. There may additionally be included $AlCl_3$, $GaCl_3$, $InCl_3$, $TlCl_3$, and so on. Particularly, $B_2H_6$ and $BF_3$ are suitable.

As a starting substance effectively used for introduction of the Group V elements, there may be included, specifically for introduction of phosphorus atoms, phosphorus hydrides such as $PH_3$ and $P_2H_4$, phosphorus halides such as $PH_4I$, $PF_3$, $PF_5$, $PCl_3$, $PCl_5$, $PBr_3$, $PBr_5$, and $PI_3$, and so on. There may additionally be included $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, and so on. Particularly, $PH_3$ and $PF_3$ are suitable.

The aforementioned gasifiable compounds may be diluted with a gas such as $H_2$, He, Ne, Ar, Xe, or Kr as occasion may demand, to be introduced into the deposition chamber.

Particularly, in the case of deposition of a layer demonstrating little absorption of light or a layer having a wide bandgap, such as the microcrystalline or polycrystalline semiconductors or a-SiC:H, it is preferred that the source gas be diluted with hydrogen gas and that relatively large high-frequency power be introduced.

The semiconductor layer 203 used in the present invention may be a stack of structures for generating electromotive force, known as the tandem structure. For effectively utilizing the spectrum of light, the photovoltaic element on the light incidence side is normally one having an effective conversion efficiency to short wavelengths and the lower photovoltaic element is one capable of effectively absorbing light of longer wavelengths as well. In order to raise the collection efficiency without loss of photogenerated carriers due to recombination in the semiconductor layer, the tandem devices can be made of materials having the same spectral response. The tandem structure may be of multiple stages including three or more stages. These tandem structures may be such that the structures of the respective photovoltaic elements are the same or different. That is, they may be of the structure of pin+pin or of the structure of pin+Schottky junction.

For producing the elements having the photovoltaic structure using these semiconductor materials, the methods such as vacuum vapor deposition, sputtering, ion plating, and CVD can be applied, and particularly, CVD is excellent in introduction of a dopant and in stacking. The gas exciting method of CVD is one using DC, low-frequency wave, RF, or microwave. As the source gas of CVD, there are used silane, disilane, germane, digermane, etc., and derivatives thereof.

In the present invention, the collector electrode 205 is formed in a portion on the transparent conductive layer 204 with necessity where the resistivity of the transparent conductive layer 204 is not low enough, and functions to lower the resistivity of the electrode and to lower the series resistance of the photovoltaic elements. As the material for the collector electrode 205, there may be included metals such as gold, silver, copper, aluminum, nickel, iron, chromium, molybdenum, tungsten, titanium, cobalt, tantalum, niobium, and zirconium, or alloys such as stainless steel, or electroconductive pastes using powdered metal. The shape of the collector electrode 205 is such a branch shape as to avoid intercepting the incident light to the semiconductor layer as much as possible.

The percentage of the area of the collector electrode to the total area of the photovoltaic device is preferably not more than 15%, more preferably not more than 10%, and still more preferably not more than 5%.

Further, for formation of the pattern of the collector electrode, a mask can be used. As the method for forming the collector electrode, there are used evaporation, sputtering, electroplating, printing, and so on.

When the photoelectric conversion elements of the present invention are used to fabricate a photovoltaic device (module or panel) of desired output voltage and output current, the photoelectric conversion elements of the present invention are connected in series or in parallel, protective layers are formed on the top surface and the back surface, and output lead-out electrodes and the like are attached thereto. When the photoelectric conversion elements of the present invention are connected in series, a diode for prevention of reverse flow may sometimes be incorporated.

In the following examples, the present invention will be described in detail with examples of solar cells as photoelectric conversion elements, but it should be noted that the present invention is by no means intended to be limited to these examples.

EXAMPLE 1

The solar cells of FIG. 2 were produced with three pin junctions in the semiconductor layer. Specifically, the solar cells were made in the structure of support 201-1 (SUS430 measuring 15×15 $cm^2$ and thickness 0.2 mm)/metal layer (Ag) 201-2/transparent electroconductive layer (ZnO) 202/semiconductor layer 203/transparent electroconductive layer (ITO) 204/collector electrode (Cr) 205 by the methods described above.

Figure 4A:
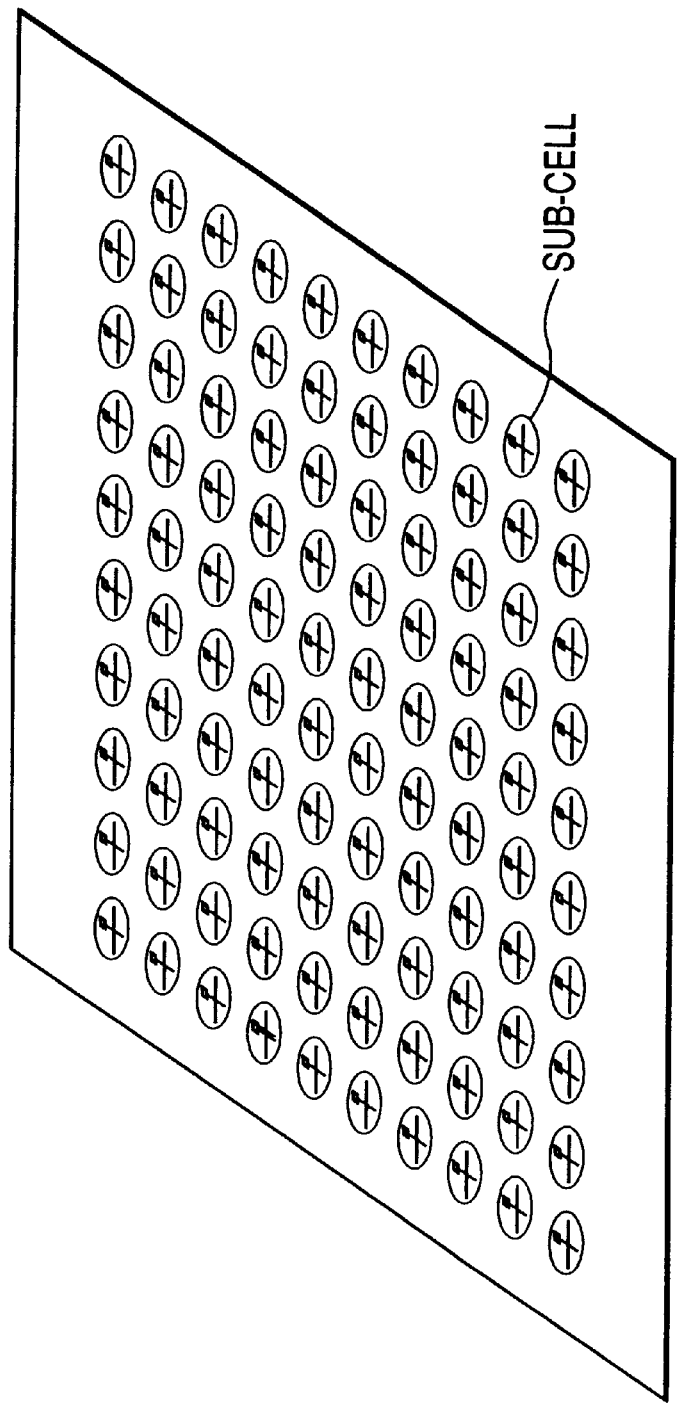
FIG. 4A is a schematic perspective view for explaining the configuration and arrangement of sub-cells of a solar cell of examples of the present invention and FIG. 4B is a enlarged plan view of the sub-cell shown in FIG. 4A.
Figure 4B:
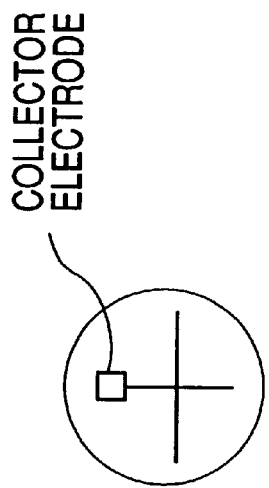

First, the metal layer (Ag) 201-2 was made on the support 201-1 by the normal sputtering method to make the conductive substrate 201. Then the conductive substrate 201 was immersed in the hot water of 60° C. in the hot water bath by use of the apparatus of FIG. 3 to be heated preliminarily. On this preliminarily heated conductive substrate 201, the transparent conductive layer (ZnO) 202 was formed in the thickness of 500 nm, using the aqueous solution containing dextrin, nitric ions, and zinc ions. The conditions on that occasion were the solution temperature 70° C., the concentration of dextrin 0.05 g/l, and the current density 100 mA/dm. The semiconductor layer 203 was constructed in the structure of first n-type doped layer a-Si:H:P/first i-type layer a-SiGe:H/first p-type doped layer μc-Si:H:B/second n-type doped layer a-Si:H:P/second i-type layer a-SiGe:H/second p-type doped layer μc-Si:H:B/third n-type doped layer a-Si:H:P/third i-type layer a-Si:H/third p-type doped layer μc-Si:H:B by the plasma CVD process. The transparent conductive layer (ITO) 204 was made by the normal sputtering process and the collector electrode (Cr) 205 by the normal vacuum evaporation process. The transparent conductive layer (ITO) 204 was made in the form of sub-cells by forming totally 100 disks having the area of 1 cm² on the semiconductor layer by masking, as shown in FIGS. 4A and 4B, and the collector electrode was formed on each sub-cell. Five types of solar cells were prepared under the same conditions except for the transparent conductive layer (ZnO) 202 in such a manner that the ratio of the X-ray diffraction intensity of the (103) plane to the X-ray diffraction intensity of the (002) plane of the transparent conductive layer (ZnO) 202 used herein ranged from 0 to 1 (Example 1-1 to Example 1-5).

During the formation of the transparent conductive layer, concentrations of zinc ions in the aqueous solution were changed as shown in Table 1 below.

The solar cell characteristics of these solar cells were measured using a solar simulator (AM 1.5, 100 mW/cm², surface temperature 25° C.). An average was calculated for the 100 sub-cells of each solar cell, and the averages thus obtained were regarded as the characteristics of the solar cells.

Table 1 below shows comparison of Jsc among Example 1-1 to Example 1-5. The values of Jsc are those resulting from normalization based on 1 for Example 1-1. It is seen from this table that a significant increase appears in the value of Jsc of the samples where the X-ray diffraction intensity of the (103) plane is ⅓ or more of the X-ray diffraction intensity of the (002) plane. The above proved that the zinc oxide thin film of the present invention is more excellent than the conventional films.

TABLE 1

|  | Example 1-1 | Example 1-2 | Example 1-3 | Example 1-4 | Example 1-5 |
| --- | --- | --- | --- | --- | --- |
| (103)/(002) | 0 | 1/4 | 1/3 | 2/3 | 1 |
| Jsc | 1.0 | 1.1 | 1.4 | 1.5 | 1.5 |
| Concentration of Zn ions (mol/l) | 0.025 | 0.05 | 0.1 | 0.15 | 0.2 |

EXAMPLE 2

The solar cells of FIG. 2 were produced with three pin junctions in the semiconductor layer. Specifically, the solar cells were constructed in the structure of support 201-1 (SUS430 measuring 15×15 cm² and thickness 0.2 mm)/metal layer (Ag) 201-2/transparent conductive layer (ZnO) 202/semiconductor layer 203/transparent conductive layer (ZnO) 204/collector electrode (Cr) 205 by the methods described above.

First, the metal layer (Ag) 201-2 was made on the support 201-1 by the normal sputtering method to make the conductive substrate 201. Then the conductive substrate 201 was immersed in the hot water of 60° C. in the hot water bath by use of the system of FIG. 3 to be heated preliminarily. On this preliminarily heated conductive substrate 201, the transparent conductive layer (ZnO) 202 was formed in the thickness of 500 nm, using the aqueous solution containing dextrin, nitric ions, and zinc ions. The conditions were the same as in Example 1. The semiconductor layer 203 was constructed in the structure of first n-type doped layer a-Si:H:P/first i-type layer a-SiGe:H/first p-type doped layer μc-Si:H:B/second n-type doped layer a-Si:H:P/second i-type layer a-SiGe:H/second p-type doped layer μc-Si:H:B/third n-type doped layer a-Si:H:P/third i-type layer a-Si:H/third p-type doped layer μc-Si:H:B by the plasma CVD process. The transparent conductive layer (ZnO) 204 was formed by the same method as the transparent conductive layer (ZnO) 202 was, and the collector electrode (Cr) 205 by the normal vacuum evaporation process. The transparent conductive layer (ZnO) 204 was made in the form of the sub-cells by forming totally 100 disks having the area of 1 cm² on the semiconductor layer by masking, as shown in FIGS. 4A and 4B, and the collector electrode was formed on each sub-cell. Five types of solar cells were prepared under the same conditions except for the transparent conductive layers (ZnO) 202, 204 in such a manner that the ratio of the X-ray diffraction intensity of the (103) plane to the X-ray diffraction intensity of the (002) plane of the transparent conductive layers (ZnO) 202, 204 used herein ranged from 0 to 1 (Example 2-1 to Example 2-5).

During the formation of the transparent conductive layers, concentrations of zinc ions in the aqueous solution were changed as shown in Table 2 below.

Solar cell characteristics of these solar cells were measured using the solar simulator (AM 1.5, 100 mW/cm², surface temperature 25° C.). An average was calculated for the 100 sub-cells of each solar cell, and the averages thus obtained were regarded as the characteristics of the solar cells.

Table 2 below shows comparison of Jsc among Example 2-1 to Example 2-5. The values of Jsc are those resulting from normalization based on 1 for Example 2-1. It is seen from this table that a significant increase appears in the value of Jsc of the samples where the X-ray diffraction intensity of the (103) plane is ⅓ or more of the X-ray diffraction intensity of the (002) plane. The above proved that the zinc oxide thin film of the present invention is more excellent than the conventional films.

TABLE 2

|  | Example 2-1 | Example 2-2 | Example 2-3 | Example 2-4 | Example 2-5 |
| --- | --- | --- | --- | --- | --- |
| (103)/(002) | 0 | 1/4 | 1/3 | 2/3 | 1 |
| Jsc | 1.0 | 1.0 | 1.3 | 1.4 | 1.5 |
| Concentration of Zn ions (mol/l) | 0.025 | 0.05 | 0.1 | 0.15 | 0.2 |

EXAMPLE 3

The solar cells of FIG. 2 were produced with three pin junctions in the semiconductor layer. Specifically, the solar cells were constructed in the structure of support 201-1 (SUS430 measuring 15×15 cm² and thickness 0.2 mm)/metal layer (Ag) 201-2/transparent conductive layer (ZnO) 202/semiconductor layer 203/transparent conductive layer (ITO) 204/collector electrode (Cr) 205 by the methods described above.

First, the metal layer (Ag) 201-2 was made on the support 201-1 by the normal sputtering method to make the conductive substrate 201. Then the conductive substrate 201 was immersed in the hot water of 60° C. in the hot water bath by use of the system of FIG. 3 to be heated preliminarily. On this preliminarily heated conductive substrate 201, the transparent conductive layer (ZnO) 202 was formed in the thickness of 500 nm, using the aqueous solution containing glucose, nitric ions, and zinc ions. The conditions on that occasion were the solution temperature 60° C., the concentration of glucose 0.1 g/l, and the current density 300 mA/dm. The semiconductor layer 203 was constructed in the structure of first n-type doped layer a-Si:H:P/first i-type layer a-SiGe:H/first p-type doped layer μc-Si:H:B/second n-type doped layer a-Si:H:P/second i-type layer a-SiGe:H/second p-type doped layer μc-Si:H:B/third n-type doped layer a-Si:H:P/third i-type layer a-Si:H/third p-type doped layer μc-Si:H:B by the plasma CVD process. The transparent conductive layer (ITO) 204 was made by the normal sputtering process and the collector electrode (Cr) 205 by the normal vacuum evaporation process. The transparent conductive layer (ITO) 204 was made in the form of the sub-cells by forming totally 100 disks having the area of 1 cm$^2$ on the semiconductor layer by masking, as shown in FIGS. 4A and 4B, and the collector electrode was formed on each sub-cell. Five types of solar cells were prepared under the same conditions except for the transparent conductive layer (ZnO) 202 in such a manner that the ratio of the X-ray diffraction intensity of the (101) plane to the X-ray diffraction intensity of the (103) plane of the transparent conductive layer (ZnO) 202 used herein ranged from 0 to 1.5 (Example 3-1 to Example 3-5).

During the formation of the transparent conductive layer, concentrations of zinc ions in the aqueous solution were changed as shown in Table 3 below.

The solar cell characteristics of these solar cells were measured using the solar simulator (AM 1.5, 100 mW/cm$^2$, surface temperature 25° C.) and shunt resistances of the 100 sub-cells of each solar cell were measured. Sub-cells having shunt resistances necessary for practical use were determined to be survivor sub-cells, the yield of each solar cell was evaluated by the number of survivor sub-cells thereof, and the yields obtained were compared among the solar cells.

Table 3 below shows comparison of the yields among Example 3-1 to Example 3-5. It is seen from this table that the yields are particularly excellent in the samples where the X-ray diffraction intensity of the (103) plane is equal to or larger than that of the (101) plane. The above proved that the zinc oxide thin film of the present invention is more excellent than the conventional films.

TABLE 3

| | Example 3-1 | Example 3-2 | Example 3-3 | Example 3-4 | Example 3-5 |
|---|---|---|---|---|---|
| (101)/(103) | 0 | 0.5 | 1.0 | 1.2 | 1.5 |
| Number of survivor subcells | 100 | 100 | 100 | 80 | 70 |

TABLE 3-continued

| | Example 3-1 | Example 3-2 | Example 3-3 | Example 3-4 | Example 3-5 |
|---|---|---|---|---|---|
| Concentration of Zn ions (mol/l) | 0.1 | 0.15 | 0.2 | 0.3 | 0.4 |

EXAMPLE 4

The solar cells of FIG. 2 were produced with three pin junctions in the semiconductor layer. Specifically, the solar cells were constructed in the structure of support 201-1 (SUS430 measuring 15×15 cm$^2$ and thickness 0.2 mm)/metal layer (Ag) 201-2/transparent conductive layer (ZnO) 202/semiconductor layer 203/transparent conductive layer (ZnO) 204/collector electrode (Cr) 205 by the methods described above.

First, the metal layer (Ag) 201-2 was made on the support 201-1 by the normal sputtering method to make the conductive substrate 201. Then the conductive substrate 201 was immersed in the hot water of 60° C. in the hot water bath by use of the system of FIG. 3 to be heated preliminarily. On this preliminarily heated conductive substrate 201, the transparent conductive layer (ZnO) 202 was formed in the thickness of 500 nm, using the aqueous solution containing glucose, nitric ions, and zinc ions. The conditions were the same as in Example 3. The semiconductor layer 203 was constructed in the structure of first n-type doped layer a-Si:H:P/first i-type layer a-SiGe:H/first p-type doped layer μc-Si:H:B/second n-type doped layer a-Si:H:P/second i-type layer a-SiGe:H/second p-type doped layer μc-Si:H:B/third n-type doped layer a-Si:H:P/third i-type layer a-Si:H/third p-type doped layer μc-Si:H:B by the plasma enhanced CVD process. The transparent conductive layer (ZnO) 204 was made by the same process as the transparent conductive layer (ZnO) 202 was and the collector electrode (Cr) 205 by the normal vacuum evaporation process. The transparent conductive layer (ZnO) 204 was made in the form of the sub-cells by forming totally 100 disks of the area of 1 cm$^2$ on the semiconductor layer by masking, as shown in FIGS. 4A and 4B, and the collector electrode was formed on each sub-cell. Five types of solar cells were prepared under the same conditions except for the transparent conductive layers (ZnO) 202, 204 in such a manner that the ratio of the X-ray diffraction intensity of the (101) plane to the X-ray diffraction intensity of the (103) plane of the transparent conductive layers (ZnO) 202, 204 used herein ranged 0 to 1.5 (Example 4-1 to Example 4-5).

During the formation of the transparent conductive layer, concentrations of zinc ions in the aqueous solution were changed as shown in Table 4 below.

The solar cell characteristics of these solar cells were measured using the solar simulator (AM 1.5, 100 mW/cm$^2$, surface temperature 25° C.) and shunt resistances of the 100 sub-cells of each solar cell were measured. Sub-cells having shunt resistances necessary for practical use were determined to be survivor sub-cells, the yield of each solar cell was evaluated by the number of survivor sub-cells thereof, and the yields obtained were compared among the solar cells.

Table 4 below shows comparison of the yields among Example 4-1 to Example 4-5 based on normalization to Example 4-1. It is seen from this table that the yields are particularly excellent in the samples where the X-ray diffraction intensity of the (103) plane is equal to or larger than that of the (101) plane. The above proved that the zinc oxide thin film of the present invention is more excellent than the conventional films.

TABLE 4

|  | Example 4-1 | Example 4-2 | Example 4-3 | Example 4-4 | Example 4-5 |
|---|---|---|---|---|---|
| (101)/(103) | 0 | 0.5 | 1.0 | 1.2 | 1.5 |
| Number of survivor subcells | 1.0 | 1.0 | 1.0 | 0.85 | 0.80 |
| Concentration of Zn ions (mol/l) | 0.1 | 0.15 | 0.2 | 0.3 | 0.4 |

As described above, according to the present invention, by employing the zinc oxide thin film having the X-ray diffraction peak of the (103) plane of zinc oxide crystal, more preferably, the zinc oxide thin film wherein the X-ray diffraction intensity of the (103) plane is $\frac{1}{3}$ or more of the X-ray diffraction intensity of the (002) plane, it is possible to readily obtain the surface configuration with sufficient unevenness demonstrating the optical confinement effect without the need for the preparation under the high-temperature condition nor for the increase in the thickness, whereby the zinc oxide thin film with the increased texture level and with the improved short circuit current density (Jsc) can be realized at low cost; and making the X-ray diffraction intensity of the (103) plane equal to or larger than the X-ray diffraction intensity of the (101) plane makes it possible to raise the yield.

Further, by forming a photoelectric conversion element using the zinc oxide thin film of the present invention, the production cost can be decreased and the photoelectric conversion element can be realized at a high yield and with improved uniformity. Particularly, the production cost of a solar cell can be reduced to a great extent.

What is claimed is:

1. A zinc oxide thin film supported on a substrate, said film having an X-ray diffraction pattern such that an X-ray diffraction intensity of the (103) plane of zinc oxide crystal is $\frac{1}{3}$ or more of an X-ray diffraction intensity of the (002) plane of zinc oxide crystal.

2. A zinc oxide thin film supported on a substrate, said film having an X-ray diffraction pattern such that an X-ray diffraction intensity of the (103) plane of zinc oxide crystal is not less than an X-ray diffraction intensity of the (101) plane of zinc oxide crystal.

3. A zinc oxide thin film supported on a substrate, said film having an X-ray diffraction pattern such that an X-ray diffraction intensity of the (103) plane of zinc oxide crystal is $\frac{1}{3}$ or more of an X-ray diffraction intensity of the (002) plane of zinc oxide crystal and is not less than an X-ray diffraction intensity of the (101) plane of zinc oxide crystal.

4. A process for producing a zinc oxide thin film supported on a substrate comprising forming the film by electrocrystallization, and further comprising controlling the electrocrystallization such that an X-ray diffraction intensity of the (103) plane of zinc oxide crystal of said zinc oxide thin film is $\frac{1}{3}$ or more of an X-ray diffraction intensity of the (002) plane of zinc oxide crystal.

5. The process according to claim 4, wherein a texture level of said zinc oxide film is increased by the controlling step.

6. A process for producing a zinc oxide thin film supported on a substrate comprising forming the film by electrocrystallization, and further comprising controlling the electrocrystallization such that an X-ray diffraction intensity of the (103) plane of zinc oxide crystal of said zinc oxide film is not less than an X-ray diffraction intensity of the (101) plane of zinc oxide crystal.

7. A process for producing a zinc oxide thin film supported on a substrate comprising forming the film by electrocrystallization, and further comprising controlling the electrocrystallization such that an X-ray diffraction intensity of the (103) plane of zinc oxide crystal of said zinc oxide film is $\frac{1}{3}$ or more of an X-ray diffraction intensity of the (002) plane of zinc oxide crystal and so that an x-ray diffraction intensity of the (103) plane of zinc oxide crystal of said zinc oxide thin film is not less than an X-ray diffraction intensity of the (101) plane of zinc oxide crystal.

* * * * *

UNITED STATES PATENT AND TRADEMARK OFFICE
CERTIFICATE OF CORRECTION

PATENT NO.    : 6,242,080 B1
DATED         : June 5, 2001
INVENTOR(S)   : Takaharu Kondo It is certified that error appears in the above-identified patent and that said Letters Patent is hereby corrected as shown below:

<u>Title page,</u>
Item [73], Assignee, "Canon Kabushiki Kaisha (JP)" should read
-- Canon Kabushiki Kaisha, Tokyo (JP) --.

<u>Column 1,</u>
Line 51, "29p-MF-22:" should read --29p-MF-2: --; and
Line 54, "51th" should read -- 51st --.

<u>Column 2,</u>
Line 13, "c axis" should read -- c-axis --.

<u>Column 3,</u>
Line 22, "do" should read -- does --; and
Line 41, "grow" should read -- grows --.

<u>Column 16,</u>
Line 40, "x-ray" should read -- X-ray --.

Signed and Sealed this

Eighth Day of October, 2002

Attest:

JAMES E. ROGAN
Attesting Officer       *Director of the United States Patent and Trademark Office*